US011289312B2

(12) United States Patent
Allen et al.

(10) Patent No.: US 11,289,312 B2
(45) Date of Patent: Mar. 29, 2022

(54) PHYSICAL VAPOR DEPOSITION (PVD) CHAMBER WITH IN SITU CHAMBER CLEANING CAPABILITY

(71) Applicant: APPLIED MATERIALS, INC., Santa Clara, CA (US)

(72) Inventors: Adolph M. Allen, Oakland, CA (US); Vanessa Faune, San Jose, CA (US); Zhong Qiang Hua, Saratoga, CA (US); Kirankumar Neelasandra Savandaiah, Bangalore (IN); Anantha K. Subramani, San Jose, CA (US); Philip A. Kraus, San Jose, CA (US); Tza-Jing Gung, San Jose, CA (US); Lei Zhou, San Jose, CA (US); Halbert Chong, San Jose, CA (US); Vaibhav Soni, Sunnyvale, CA (US); Kishor Kalathiparambil, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/438,560

(22) Filed: Jun. 12, 2019

(65) Prior Publication Data
US 2020/0395198 A1 Dec. 17, 2020

(51) Int. Cl.
*H01J 37/32* (2006.01)
*H01J 37/34* (2006.01)
*C23C 16/455* (2006.01)
*C23C 14/54* (2006.01)

(52) U.S. Cl.
CPC ...... *H01J 37/32862* (2013.01); *C23C 14/541* (2013.01); *C23C 16/455* (2013.01); *H01J 37/3244* (2013.01); *H01J 37/3441* (2013.01)

(58) Field of Classification Search
CPC .................................................. C23C 14/541
USPC ................................................... 204/298.09
See application file for complete search history.

(56) References Cited

U.S. PATENT DOCUMENTS

| 4,756,810 | A | * | 7/1988 | Lamont, Jr. | C23C 14/35 204/192.3 |
| 4,933,063 | A | * | 6/1990 | Katsura | H01J 37/3447 204/298.03 |
| 5,518,593 | A | * | 5/1996 | Hosokawa | C23C 14/3407 118/641 |
| 5,757,255 | A | | 5/1998 | Masayuki et al. | |

(Continued)

FOREIGN PATENT DOCUMENTS

KR    10-2008-0088788 A    10/2008

OTHER PUBLICATIONS

International Search Report and Written Opinion for PCT/US2020/032612 dated Sep. 1, 2020.

*Primary Examiner* — John J Brayton
(74) *Attorney, Agent, or Firm* — Moser Taboada (57) ABSTRACT

Embodiments of process kit shields and process chambers incorporating same are provided herein. In some embodiments a process kit configured for use in a process chamber for processing a substrate includes a shield having a cylindrical body having an upper portion and a lower portion; an adapter section configured to be supported on walls of the process chamber and having a resting surface to support the shield; and a heater coupled to the adapter section and configured to be electrically coupled to at least one power source of the processes chamber to heat the shield.

18 Claims, 4 Drawing Sheets

(56) References Cited

U.S. PATENT DOCUMENTS

| | | | |
|---|---|---|---|
| 6,350,320 B1 | 2/2002 | Sherstinsky et al. | |
| 6,432,203 B1* | 8/2002 | Black | C23C 14/564 |
| | | | 118/504 |
| 6,537,622 B2 | 3/2003 | Kuo et al. | |
| 7,028,696 B2 | 4/2006 | Richardson et al. | |
| 7,318,869 B2 | 1/2008 | Chiang et al. | |
| 7,662,235 B2 | 2/2010 | Yoshida et al. | |
| 8,491,967 B2 | 7/2013 | Ma et al. | |
| 9,048,066 B2 | 6/2015 | Burgess et al. | |
| 9,127,362 B2 | 9/2015 | Scheible et al. | |
| 9,177,763 B2* | 11/2015 | Rasheed | H01J 37/32935 |
| 9,388,493 B2 | 7/2016 | Chang et al. | |
| 2002/0020429 A1* | 2/2002 | Selbrede | H01J 37/32357 |
| | | | 134/1.1 |
| 2005/0039679 A1 | 2/2005 | Kleshock et al. | |
| 2010/0055298 A1 | 3/2010 | Sommers et al. | |
| 2012/0231633 A1* | 9/2012 | Ewert | H01L 21/2855 |
| | | | 438/763 |
| 2013/0055952 A1 | 3/2013 | Subramani et al. | |
| 2015/0348773 A1 | 12/2015 | Zhu et al. | |
| 2015/0380223 A1* | 12/2015 | Scheible | H01L 21/68735 |
| | | | 204/298.09 |
| 2017/0076924 A1 | 3/2017 | Johanson et al. | |
| 2017/0088942 A1 | 3/2017 | Rasheed et al. | |

* cited by examiner

PHYSICAL VAPOR DEPOSITION (PVD) CHAMBER WITH IN SITU CHAMBER CLEANING CAPABILITY

FIELD

Embodiments of the present disclosure generally relate to semiconductor substrate processing equipment.

BACKGROUND

During physical vapor deposition (PVD) processing of a substrate, PVD chambers deposit sputtered material that may form a film on all components surrounding the plasma. Over time unwanted deposited material may form on process kit shields that are typically provided in the PVD chamber. While deposition of sputtered material on process kit shields is an accepted practice, such sputtered material can shed particles that can damage a sputtering target used during PVD and/or can contaminate a substrate being processed.

Maintenance of the process kit shields typically includes removing the process kit shields, which can include multiple components, from the PVD chamber, chemically etching the process kit shields to an original state and reinstalling the process kit shields so that the process kit shields can be reused. However, the inventors have observed that such processes can be time consuming, laborious, and costly, and undesirably increase chamber downtime.

Therefore, the inventors have provided methods and apparatus that provide in situ chamber cleaning capability.

SUMMARY

Embodiments of process kit shields, process chambers incorporating such process kit shields, and methods of use of same are provided herein. In some embodiments, a process kit configured for use in a process chamber for processing a substrate includes a shield having a cylindrical body having an upper portion and a lower portion; an adapter section configured to be supported on walls of the process chamber and having a resting surface to support the shield; and a heater coupled to the adapter section and configured to be electrically coupled to at least one power source of the processes chamber to heat the shield.

In some embodiments, a process chamber configured for processing a substrate includes a chamber wall at least partially defining an inner volume within the process chamber; a sputtering target disposed in an upper section of the inner volume; a substrate support having a support surface to support a substrate below the sputtering target; and a process kit surrounding the sputtering target and the substrate support, the process kit comprising: a shield having a cylindrical body having an upper portion and a lower portion; an adapter section supported on a process chamber wall of the process chamber and having a resting surface to support the shield; and a heater coupled to the adapter section and configured to be electrically coupled to at least one power source of the processes chamber to heat the shield.

In some embodiments, a method for cleaning a process kit configured for processing a substrate includes maintaining a sputtering target disposed in an inner volume of a process chamber configured for processing a substrate at a first temperature; and heating a shield of a process kit to a second temperature that is different from the first temperature causing an activated cleaning gas in the inner volume of the process chamber to react with material deposited on the shield for selectively removing the material from the shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits and process chambers incorporating such process kits are provided herein. Particularly, the present disclosure provides methods and apparatus that can be used in situ for chemically based cleaning of process kits provided in the process chambers, e.g., PVD chambers. The methods and apparatus can be used to remove unwanted deposited material on the process kits without damaging a target used during PVD. Accordingly, particle levels that can be caused by flaking of the deposited material on the process kits during processing are greatly reduced and/or maintained at acceptable levels, which, in turn, results in significantly more PVD chamber up time and availability and significantly extends a mean time between cleans. (MTBC).

Figure 1:
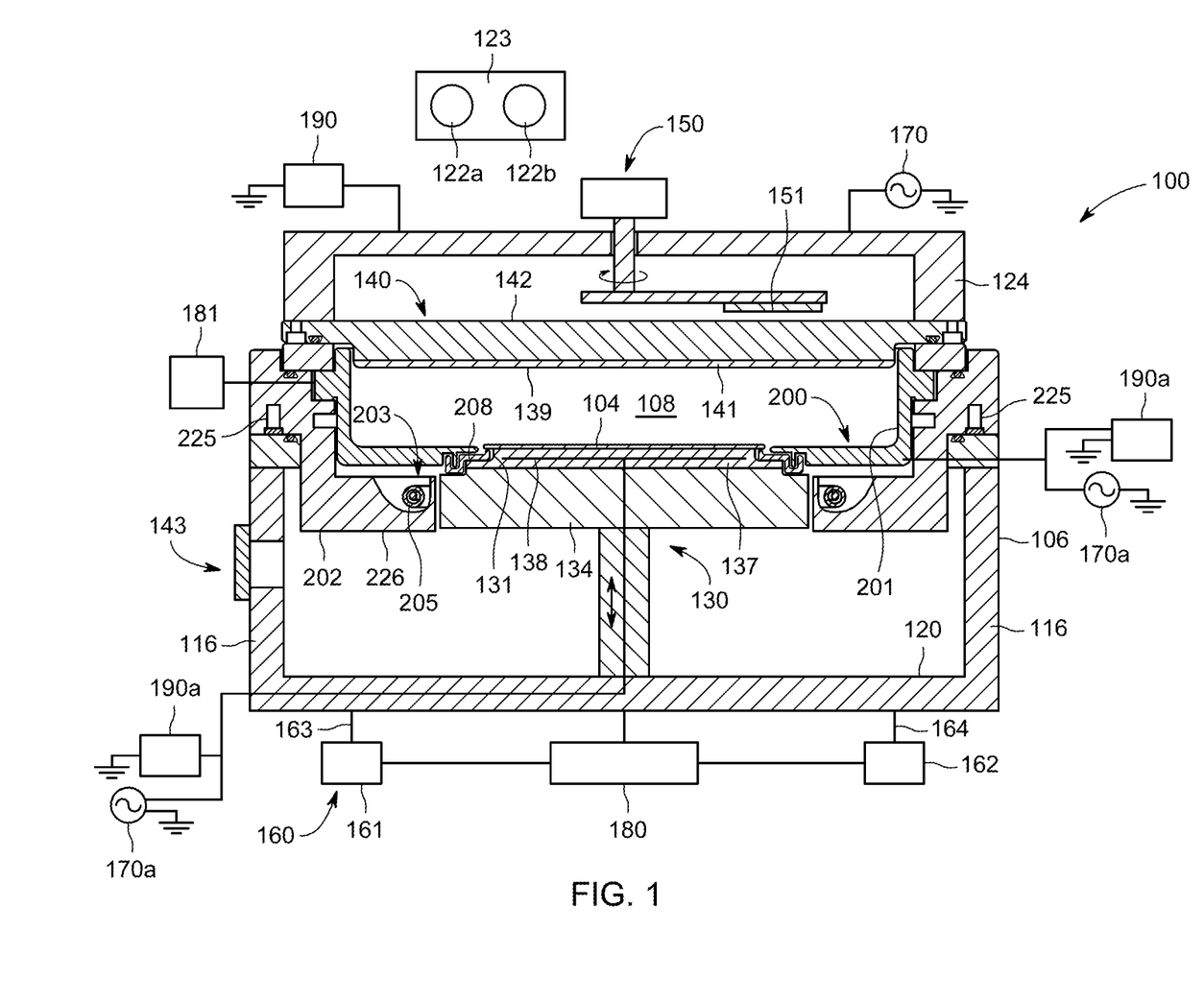
FIG. 1 depicts a schematic side view of a process chamber in accordance with some embodiments of the present disclosure.

FIG. 1 depicts a schematic, cross-sectional view of a process chamber 100 (e.g., a PVD chamber) having a process kit 200 in accordance with some embodiments of the present disclosure. Examples of PVD chambers suitable for use with process kit shields of the present disclosure include the ALPS® Plus, SIP ENCORE®, Applied Endura Impulse®, and Applied Endura Avenir®, and other PVD processing chambers commercially available from Applied Materials, Inc., of Santa Clara, Calif. Other processing chambers from Applied Materials, Inc. or other manufacturers may also benefit from the inventive apparatus disclosed herein.

The process chamber 100 comprises chamber walls 106 that enclose an inner volume 108. The chamber walls 106 include sidewalls 116, a bottom wall 120, and a ceiling or lid 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of carbon, aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The substrate support surface 138 of the pedestal 134 receives and supports the substrate 104 during processing. The pedestal 134 may include an electrostatic chuck or a heater (such as an electrical resistance heater, heat exchanger, or other suitable heating device). The substrate 104 can be introduced into the process chamber 100 through a substrate loading inlet 143 in the sidewall 116 of the process chamber 100 and placed onto the substrate support 130. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 is biasable and can be maintained at an electrically floating potential or grounded during plasma operation. For example, in some embodiments the pedestal 134 may be biased to a given potential such that during a cleaning process of the process kit 200 an RF power source 170 can be used to ignite one or more gases (e.g., a cleaning gas) to create a plasma including ions and radicals that can used to react with one or more materials deposited on the process kit 200, as will be described in greater detail below.

The pedestal 134 has a substrate support surface 138 having a plane substantially parallel to a sputtering surface 139 of a sputtering target 140. The sputtering target 140 comprises a sputtering plate (or target material) 141 mounted to a backing plate 142 using one or more suitable mounting devices, e.g., a solder bond. The sputtering plate 141 comprises a material to be sputtered onto the substrate 104. The backing plate 142 is made from a metal, such as, for example, stainless steel, aluminum, copper-chromium or copper-zinc. The backing plate 142 can be made from a material having a thermal conductivity that is sufficiently high to dissipate the heat generated in the sputtering target 140, which is formed in both the sputtering plate 141 and the backing plate 142. The heat is generated from the eddy currents that arise in the sputtering plate 141 and the backing plate 142 and also from the bombardment of energetic ions from the plasma onto the sputtering surface 139 of the sputtering target 140. The higher thermal conductivity backing plate 142 allows dissipation of the heat generated in the sputtering target 140 to the surrounding structures or even to a heat exchanger which may be mounted behind the backing plate 142 or may be in the backing plate 142, itself. For example, the backing plate 142 can comprise channels (not shown) to circulate a heat transfer fluid therein. A suitably high thermal conductivity of the backing plate 142 is at least about 200 W/mK, for example, from about 220 to about 400 W/mK. Such a thermal conductivity level allows the sputtering target 140 to be operated for longer process time periods by dissipating the heat generated in the sputtering target 140 more efficiently, and also allows for relatively rapid cooling of the sputtering plate 141, e.g., when the area on and around the process kit 200 needs to be cleaned.

In combination with a backing plate 142 made of a material having a high thermal conductivity and low resistivity, or separately and by itself, the backing plate 142 may comprises a backside surface having one or more grooves (not shown). For example, a backing plate 142 could have a groove, such as annular groove, or a ridge, for cooling a backside of the sputtering target 140. The grooves and ridges can also have other patterns, for example, rectangular grid pattern, spiral patterns, or simply straight lines running across the backside surface.

In some embodiments, the process chamber 100 may include a magnetic field generator 150 to shape a magnetic field about the sputtering target 140 to improve sputtering of the sputtering target 140. The capacitively generated plasma may be enhanced by the magnetic field generator 150 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 104. The process chamber 100 may, in addition or alternatively, comprise a magnetic field generator 150 that generates a magnetic field near the sputtering target 140 of the process chamber 100 to increase an ion density in a high-density plasma region adjacent to the sputtering target 140 to improve the sputtering of the target material.

A sputtering gas is introduced into the process chamber 100 through a gas delivery system 160, which provides gas from a gas supply 161 via conduits 163 having gas flow control valves (not shown), such as a mass flow controllers, to pass a set flow rate of the gas therethrough. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that can react with the sputtered material to form a layer on the substrate 104. The gas is then energized by an RF power source 170 to form or create a plasma to sputter the sputtering target 140. For example, the process gases become ionized by high energy electrons and the ionized gases are attracted to the sputtering material, which is biased at a negative voltage (e.g., −300 to −1500 volts). The energy imparted to an ionized gas (e.g., now positively charged gas atoms) by the electric potential of the cathode causes sputtering. In some embodiments, the reactive gases can directly react with the sputtering target 140 to create compounds and then be subsequently sputtered from the sputtering target 140. For example, the cathode can be energized by both the DC power source 190 and the RF power source. In some embodiments, the DC power source 190 can be configured to provide pulsed DC to power the cathode. Spent process gas and byproducts are exhausted from the process chamber 100 through an exhaust 162. The exhaust 162 comprises an exhaust port (not shown) that receives spent process gas and passes the spent gas to an exhaust conduit 164 having a throttle valve to control the pressure of the gas in the process chamber 100. The exhaust conduit 164 is connected to one or more exhaust pumps (not shown).

In addition, the gas delivery system 160 is configured to introduce one or more of the gases (e.g., depending on the material used for the sputtering target 140), which can be energized to create an active cleaning gas (e.g., ionized plasma or radicals), into the inner volume 108 of the process chamber 100 for performing a cleaning process of the shield 201, which will be described in greater detail below. Alternatively or additionally the gas delivery system 160 can be coupled to a remote plasma source (RPS) 165 that is configured to provide radicals (or plasma depending on the configuration of the RPS) into the inner volume 108 of the process chamber 100. The sputtering target 140 is connected to one or both of a DC power source 190 and/or the RF power source 170. The DC power source 190 can apply a bias voltage to the sputtering target 140 relative to a shield 201 of the process kit 200, which may be electrically floating during a sputtering process and/or the cleaning process. The DC power source 190, or a different DC power source 190a, can also be used to apply a bias voltage to a cover ring section 212 or a heater 203 of an adapter section 226 of the process kit 200, e.g., when performing a cleaning process of the shield 201.

While the DC power source 190 supplies power to the sputtering target 140 and other chamber components connected to the DC power source 190, the RF power source 170 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 170 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source can also be used to supply a bias voltage to the pedestal 134 and/or the cover ring section 212 e.g., when performing a cleaning process of the area on and around the process kit 200. For example, in some embodiments an additional RF power source 170a can be used to energize a biasable electrode 137 that can be embedded in the pedestal 134 (or the substrate support surface 138 of the substrate support 130). The biasable electrode can be used to supply power to the shield 201 and/or the substrate support 130. Moreover, in some embodiments, the RF power source 170 can be configured to energize the biasable electrode 137. For example, one or more additional components e.g., a switching circuit can be provided to switch the electrical path from the cover or lid 124 to the biasable electrode 137.

Various components of the process chamber 100 may be controlled by a controller 180. The controller 180 comprises program code having instruction sets to operate the components to process the substrate 104. For example, the controller 180 can comprise program code that includes substrate positioning instruction sets to operate the substrate support 130 and substrate transfer mechanism; temperature control of one or more heating components (e.g., a lamp, radiative heating, and/or embedded resistive heaters) of the heater 203; cleaning process instruction sets to an area on and around the process kit 200; power control of a microwave power source 181; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 170 to set a gas energizing power level; temperature control instruction sets to control a temperature control system in the substrate support 130 or a heat transfer medium supply to control a flowrate of the heat transfer medium to the annular heat transfer channel; and process monitoring instruction sets to monitor the process in the process chamber 100.

Figure 2:
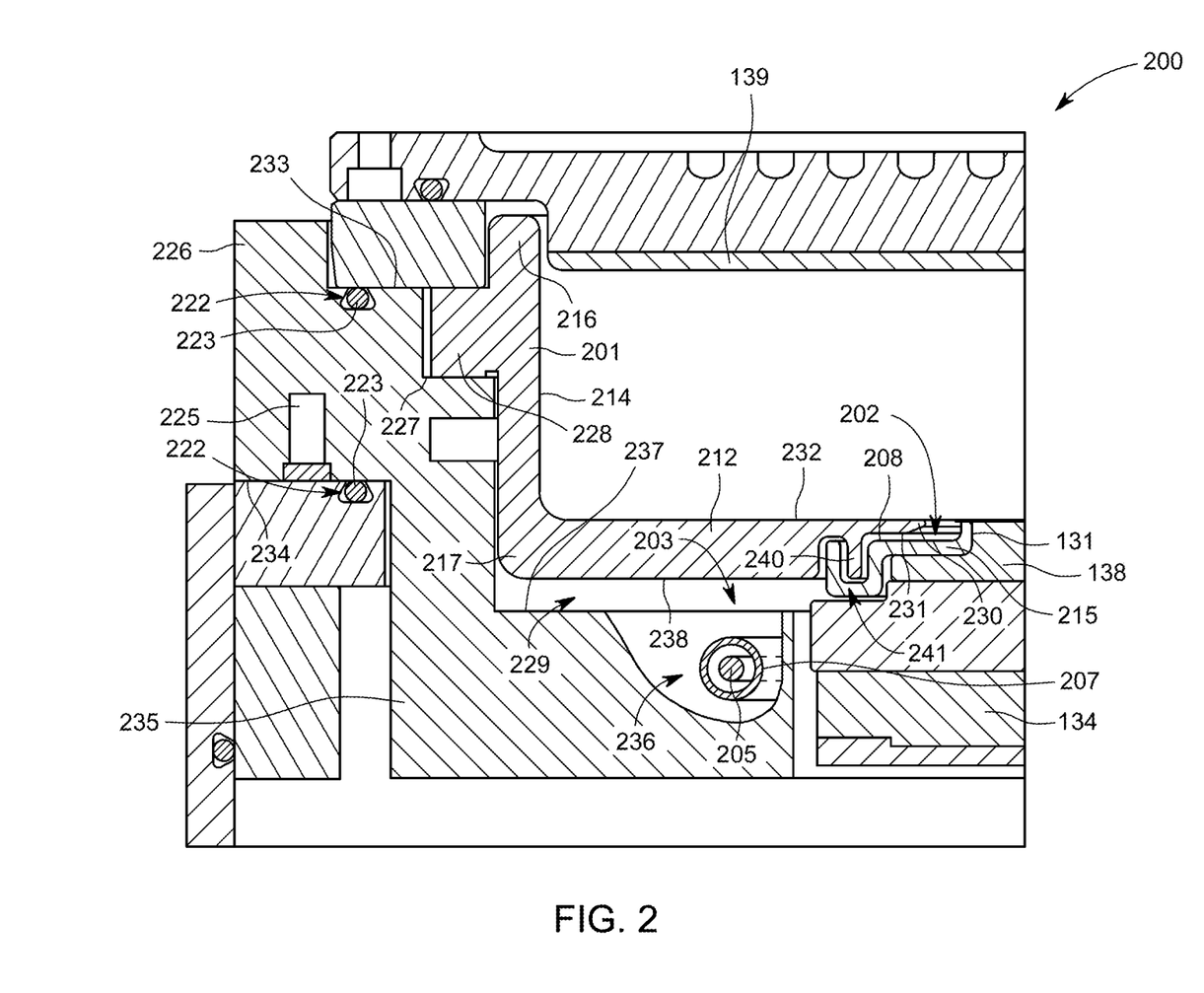
FIG. 2 depicts a schematic cross-sectional view of a process kit in accordance with some embodiments of the present disclosure.

Continuing with reference to FIG. 1, and with reference to FIG. 2, the process chamber 100 also contains the process kit 200, which comprises various components including the adapter section 226 and the shield 201 which can be easily removed from the process chamber 100, for example, to replace or repair eroded components, or to adapt the process chamber 100 for other processes. Additionally, unlike conventional process kits, which need to be removed to clean sputtering deposits off the component surfaces (e.g., the shield 201), the inventors have designed the process kit 200 for in situ cleaning to remove sputtered deposits of material on the of the shield 201, as will be described in more detail below.

The shield 201 includes a cylindrical body 214 having a diameter sized to encircle the sputtering surface 139 of the sputtering target 140 and the substrate support 130 (e.g., a diameter larger than the sputtering surface 139 and larger than the support surface of the substrate support 130). The cylindrical body 214 has an upper portion 216 configured to surround the outer edge of the sputtering surface 139 of the sputtering target 140 when installed in the chamber. The shield 201 further includes a lower portion 217 configured to surround the substrate support surface 138 of the substrate support 130 when installed in the chamber. The lower portion 217 includes a cover ring section 212 for placement about a peripheral wall 131 of the substrate support 130. The cover ring section 212 encircles and at least partially covers a deposition ring 208 disposed about the substrate support 130 to receive, and thus, shadow the deposition ring 208 from the bulk of the sputtering deposits. As noted above, in some embodiments the cover ring section 212 can be biased using the DC power source 190a and/or the RF power source 170a, for example, when the area on and around the process kit 200 needs to be cleaned. In some embodiments, the RF power source 170 or the DC power source 190 can also be configured to bias the cover ring section 212. For example, a switching circuit, can be used as described above.

The deposition ring 208 is disposed below the cover ring section 212. A bottom surface of the cover ring section 212 interfaces with the deposition ring 208 to form a tortuous path 202 and the cover ring section 212 extends radially inward from the lower portion 217 of the cylindrical body 214, as shown in FIG. 2. In some embodiments, the cover ring section 212 interfaces with but does not contact the deposition ring 208 such that the tortuous path 202 is a gap disposed between the cover ring section 212 and the deposition ring 208. For example, the bottom surface of the cover ring section 212 may include an annular leg 240 that extends into an annular trench 241 formed in the deposition ring 208. The tortuous path 202 advantageously limits or prevents plasma leakage to an area outside of the process kit 200. Moreover, the constricted flow path of the tortuous path 202 restricts the build-up of low-energy sputter deposits on the mating surfaces of the deposition ring 208 and cover ring section 212, which would otherwise cause them to stick to one another or to the overhanging edge 206 of the substrate 104. Additionally, in some embodiments, the gas delivery system 160 is in fluid communication with the tortuous path 202 for providing one or more suitable gases (e.g., process gas and/or cleaning gas) into the inner volume 108 of the process chamber 100 when the area on and around the process kit 200 needs to be cleaned.

The deposition ring 208 is at least partially covered by a radially inwardly extending lip 230 of the cover ring section 212. The lip 230 includes a lower surface 231 and an upper surface 232. The deposition ring 208 and cover ring section 212 cooperate with one another to reduce formation of sputter deposits on the peripheral walls 131 of the substrate support 130 and an overhanging edge of the substrate 104. The lip 230 of the cover ring section 212 is spaced apart from the overhanging edge 206 by a horizontal distance that may be between about 0.5 inches and about 1 inch to reduce a disruptive electrical field near the substrate 104 (i.e., an inner diameter of the lip 230 is greater than a given diameter of a substrate to be processed by about 1 inch to about 2 inches).

The deposition ring 208 comprises an annular band 215 that extends about and surrounds a peripheral wall 131 of the substrate support 130 as shown in FIG. 2. The annular band 215 comprises an inner lip 250 which extends transversely from the annular band 215 and is substantially parallel to the peripheral wall 204 of the substrate support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of the substrate support 130 that are not covered by the substrate 104 during processing. For example, the inner lip 250 surrounds and at least partially covers the peripheral wall 204 of the substrate support 130 that would otherwise be exposed to the processing environment, to reduce or even entirely preclude deposition of sputtering deposits on the peripheral wall 204. The deposition ring 208 can serve to protect the exposed side surfaces of the substrate support 130 to reduce their erosion by the energized plasma species.

The shield 201 encircles the sputtering surface 139 of the sputtering target 140 that faces the substrate support 130 and the outer periphery of the substrate support 130. The shield 201 covers and shadows the sidewalls 116 of the process chamber 100 to reduce deposition of sputtering deposits originating from the sputtering surface 139 of the sputtering target 140 onto the components and surfaces behind the shield 201. For example, the shield 201 can protect the surfaces of the substrate support 130, overhanging edge 206 of the substrate 104, sidewalls 116 and bottom wall 120 of the process chamber 100.

Continuing with reference to FIG. 2, the adapter section 226 extends radially outward adjacent from the upper portion 216. The adapter section 226 includes a sealing surface 233 and a resting surface 234 opposite the sealing surface 233. The sealing surface 233 contains an O-ring groove 222 to receive an O-ring 223 to form a vacuum seal, and the resting surface 234 rests upon (or is supported by) the sidewalls 116 of the process chamber 100; an O-ring groove 222 and an O-ring 223 can also be provided in the sidewall 116 opposite the resting surface 234.

The adapter section 226 includes an inwardly extending ledge 227 that engages a corresponding outwardly extending ledge 228 adjacent the upper portion 216 for supporting of the shield 201. The adapter section 226 includes a lower portion 235 that extends inwardly toward the pedestal 134 below the cover ring section 212. The lower portion 235 is spaced apart from the cover ring section 212 such that a cavity 229 is formed between the lower portion 235 and the cover ring section 212. The cavity 229 is defined by a top surface 237 of the lower portion 235 and a bottom surface 238 of the cover ring section 212. The distance between the top surface 237 of the lower portion 235 and a bottom surface 238 is such that maximum heat transfer from the heater 203 to the shield 201 can be achieved within a predetermined time during cleaning of the process kit 200. The cavity 229 is in fluid communication with the tortuous path 202 which allows gas, for example, introduced via the gas delivery system 160, to flow into the inner volume 108 of the process chamber 100 when the area on and around the process kit 200 needs to be cleaned.

The lower portion 235 is configured to house the heater 203. More particularly, an annular groove 236 of suitable configuration is defined within the lower portion 235 and is configured to support one or more suitable heating components including, but not limited to, a lamp, radiative heating, or embedded resistive heaters of the heater 203. In the illustrated embodiment, a radiative annular coil 205, which is surrounded by a lamp envelope 207, e.g., glass, quartz or other suitable material, is shown supported in the annular groove 236. The radiative annular coil 205 can be energized or powered using, for example, the DC power source 190 or the DC power source 190a, which can be controlled by the controller 180, to reach temperatures of about 250° C. to about 300° C. when the area on and around the process kit 200 needs to be cleaned.

The adapter section 226 can also serve as a heat exchanger about the sidewall 116 of the process chamber 100. Alternatively or additionally an annular heat transfer channel 225 can be disposed in either or both the adapter section 226 or the shield 201 (e.g., the upper portion 216) to flow a heat transfer medium. The heat transfer medium can be used to cool the adapter section 226 and/or the shield 201, for example, upon completion of the process kit 200 being cleaned, or upon completion of one or more other processes having been performed in the process chamber 100.

Figure 3:
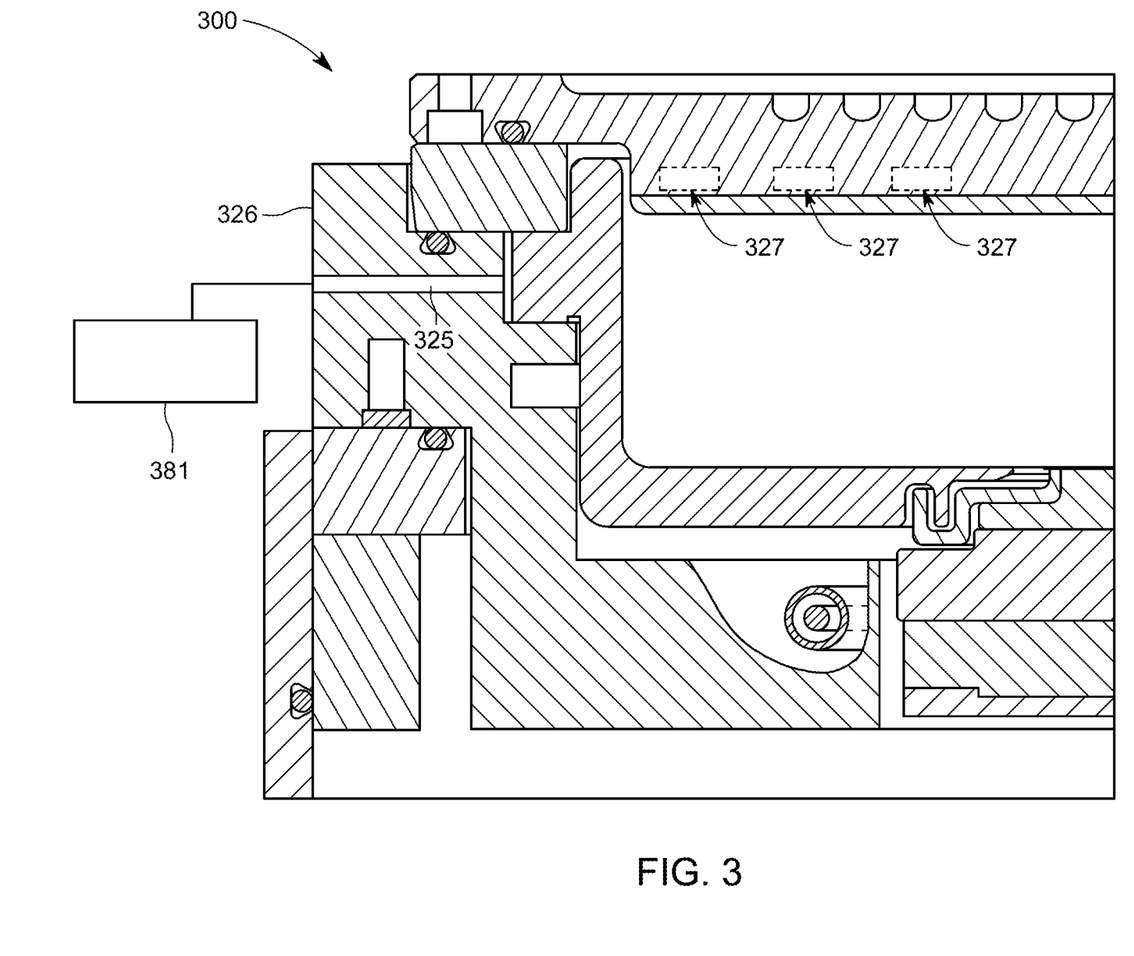
FIG. 3 depicts a schematic cross-sectional view of a process kit in accordance with some embodiments of the present disclosure.

FIG. 3 depicts a schematic cross-sectional view of a process kit 300 in accordance with some embodiments of the present disclosure. The process kit 300 is substantially similar to the process kit 200. Accordingly, only those features unique to the process kit 300 are herein described. An adapter section 326 includes an inlet or port 325 that is configured to connect to a microwave power source 381. Similar to the RF power source 170 and the DC power source 190, the microwave power source 181 is configured to create a plasma in the inner volume 108 of the process chamber 100 when the area on and around the process kit 200 needs to be cleaned. Additionally, one or more dielectric resonators 327 (shown in phantom) can be provided along the inner volume 108 in a circular array around a periphery of the sputtering surface 139 of the sputtering target 140 to ignite the plasma to create, for example, one or more radicals that can be directed toward an area that needs to be cleaned around the process kit 200.

Figure 4:
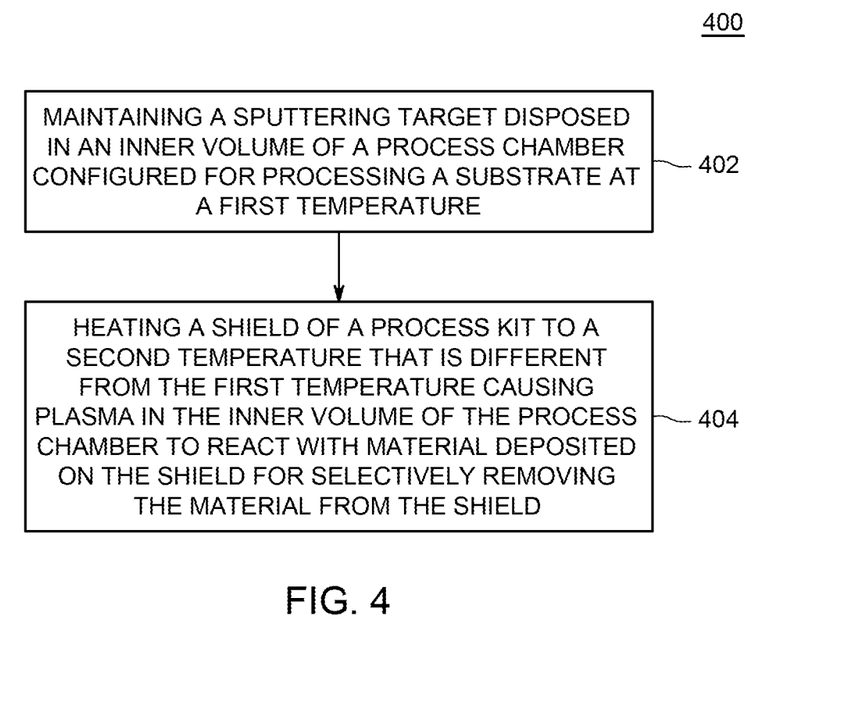
FIG. 4 is a flowchart of a method for cleaning a process kit configured for processing a substrate in accordance with some embodiments of the present disclosure.

FIG. 4 is a flowchart of a method for cleaning a process kit configured for processing a substrate in accordance with some embodiments of the present disclosure. The sputtering plate (or target material) 141 can be made from one or more suitable materials to be deposited on a substrate. For example, the sputtering plate (or target material) 141 can be made of carbon, silicon, silicon nitride, aluminum, tungsten, tungsten carbide, copper, titanium, titanium nitride, titanium carbide, carbon nitride, or the like. The specific material that the sputtering plate (or target material) 141 can be made from can depend on the material desired to be deposited on a substrate in the process chamber. The specific material that the sputtering plate (or target material) 141 is made from can influence one more factors relating to the chamber configuration and cleaning processes, e.g., the type of activated cleaning gases used for cleaning the process kit, whether a shutter (or shutter assembly) is used to protect the sputtering plate 141 while the process kit is being cleaned, etc.

In some embodiments, one or more activated cleaning gases can be used to clean on and around the process kit 200. The activated cleaning gas, for example, can be a cleaning gas introduced into the process chamber 100 and subsequently energized to form a plasma to create radicals (e.g., the activated cleaning gas) that can be directed toward the process kit 200. Alternatively or in combination, radicals (e.g., the activated cleaning gas) can be introduced into the process chamber from a remote plasma source and then directed toward the process kit 200. The cleaning gases that are activated using the plasma to form radicals of the cleaning gases can be, for example, oxygen ($O_2$), or other oxygen-containing gases e.g., ozone, hydroxide, peroxide, or the like, chlorine ($Cl_2$), or other chlorine containing gases, or the like, nitrogen, fluorine, boron, sulfur, niobium, or combinations thereof. The type of cleaning gas used can depend on, for example, the type of target material, the type of chamber (e.g., PVD etc.), a manufacturer's preference, etc. For example, if the target material is Al, the plasma can be created using $Cl_2$ or $BCl_3$, and the shield 201 can be made from a material other than Al, if the target material is Ti, the plasma can be created using $SF_6$ or $Cl_2$, if the target material is W, the plasma can be created using $Cl_2$ or other chlorine or fluorine based gases, if the target material is Cu, the plasma can be created using $NbCl_3$, and if the target material is Si, the plasma can be created using $NF_3$.

In accordance with the present disclosure, cleaning on and around the process kit 200 can be performed in accordance with routine maintenance of the process chamber 100. For example, the method 400 can be performed periodically to reduce deposition buildup on and around the process kit 200. For example, when carbon is used as the sputtering plate (or target material) 141, the method 400 can be used to remove carbon build-up. The cleaning process can be run periodically whenever sufficient materials have built up on the process kit 200. For example, the cleaning process can be performed after about 5 μm of carbon has been deposited, which can be equal to about 50 or so substrates (or wafers) of a deposition for a 1000A film deposited on each substrate.

Prior to cleaning on and around the process kit 200, a dummy wafer 122a can be loaded into the inner volume 108 of the process chamber 100 and disposed on the substrate support 130 to protect the components of the substrate support 130, e.g., the pedestal 134, the substrate support surface 138, etc. Alternatively or additionally a shutter disk 122b can placed on or over the substrate support 130 to protect the components of the substrate support 130. Conversely, neither of the dummy wafer 122a nor shutter disk 122b need be used.

Additionally, in some embodiments, the shutter disk 122b can be positioned in front of the sputtering target 140 and used to prevent the reactive gas from reaching the sputtering target 140 while the accumulated deposition on the process kit 200 is removed.

The dummy wafer 122a and/or shutter disk 122b can be stored in, for example, a peripheral holding area 123 and can be moved into the processing chamber 100 prior to cleaning on and around the process kit 200.

The inventors have found that to facilitate removal of accumulated deposited material on the process kit 200, the area on and around the process kit 200 will have to be actively heated (e.g., heated to temperatures above that which are used to process a substrate). For example, when the sputtering target 140 is carbon, to facilitate a carbon and oxygen radical reaction (e.g., to form carbon dioxide), to selectively (e.g., to concentrate cleaning to a specific area within the inner volume 108 of the process chamber 100) clean on and around the process kit 200, and to maximize cleaning on and around the process kit 200, a temperature differential between the sputtering plate 141 and the area on and around the process kit 200 needs to be maintained. Accordingly, to actively achieve such a temperature differential, the sputtering plate 141 can be kept at a relatively low temperature, e.g., a temperature of about 25° C. and to about 100° C. Backside water cooling as described above can used to achieve such temperatures. Cooling the sputtering plate 141, e.g., using backside water cooling or the like, can be useful when the area on and around the process kit 200 is cleaned shortly after PVD has been performed, e.g., when a temperature of sputtering plate 141 is relatively high. Alternatively or additionally the sputtering plate 141 can be allowed to cool over time without using any cooling devices. Accordingly, in some embodiments, at 402 the sputtering plate 141 can be maintained at a temperature of about 25° C. and to about 100° C. during the cleaning process.

Next, to ensure that the above-described temperature differential is achieved/maintained, at 404 the area on and around the process kit 200 can be actively heated to a temperature of about 250° C. to about 300° C. As noted above, the radiative annular coil 205 of the heater 203 can be energized using the DC power source 190 (or the or the DC power source 190a) to achieve such temperatures, and the amount of energy provided from the DC power source 190 to the radiative annular coil 205 can be controlled by the controller 180.

Thereafter, one or more processes can be used to create a plasma to form corresponding ions and radicals, which can used to react with the accumulated deposited material on and around the process kit 200. For example, in some embodiments, when the accumulated deposited material around the processing kit 200 is carbon, oxygen can be introduced into the inner volume 108 of the process chamber 100 using, for example, the gas delivery system 160. Once introduced, the oxygen plasma including ions and radicals can be created by energizing the oxygen gas using, for example, the RF power source 170 and the pedestal 134 or the cover ring section 212, each of which as noted above can be biased to a voltage potential using either or both the RF power source 170a or the DC power source 190a.

Alternatively or additionally, oxygen can be introduced into the inner volume 108 of the process chamber 100 using, for example, the gas delivery system 160, and the microwave power source 181 can be used to create the oxygen plasma to form the oxygen ions and radicals.

Alternatively or additionally the oxygen plasma can be created remotely using, for example, the RPS 165. For example, the oxygen plasma can be created by the RPS 165, and the oxygen ions and radicals from the oxygen plasma be directed to the process chamber.

Once oxygen gas is energized for form the oxygen plasma, the oxygen radicals react with the carbon deposited on and around the process kit 200 and convert the deposited carbon to carbon dioxide (e.g., to selectively etch or remove the carbon), which thereafter can then be pumped from the inner volume 108 of the process chamber 100 via, for example, the exhaust 162. Alternatively or additionally, some of the oxygen ions from the oxygen plasma (e.g., in addition to the oxygen radicals) can also be used to react with the carbon deposited on and around the process kit 200 for converting the deposited carbon to carbon dioxide, which can depend on the ratio of oxygen radicals to oxygen ions in the oxygen plasma. For example, a ratio of oxygen ions to oxygen radicals can be controlled so that more (or less) ionized oxygen is created in the plasma and less (or more) oxygen radicals are created.

The controller 180 can control the exhaust 162 to begin exhausting the carbon dioxide at, for example, an endpoint of carbon dioxide production, which can be detected using one or more sensors (not shown) disposed in the inner volume 108 of the process chamber 100. For example, in some embodiments, the controller 180 can use the one or more sensors to determine an end point of a cleaning time based on a composition of the exhaust gas.

Alternatively or additionally the controller 180 can be configured to control the exhaust 162 to begin exhausting the carbon dioxide at, for example, a predetermined time, which can be calculated via empirical data.

While the foregoing is directed to embodiments of the present disclosure, other and further embodiments of the disclosure may be devised without departing from the basic scope thereof.

The invention claimed is:

1. A process kit configured for use in a process chamber for processing a substrate, comprising:
 a shield having a cylindrical body having an upper portion and a lower portion, wherein the upper portion includes an outwardly extending ledge;
 an adapter section configured to be supported on walls of the process chamber and having an inwardly extending ledge that contacts the outwardly extending ledge of the shield at a position above the lower portion of the shield; and
 a heater supported in an annular cavity of the adapter section and configured to be electrically coupled to at least one power source of the processes chamber to heat the shield, wherein the annular cavity is disposed beneath a cavity defined by a top surface of a lower portion of the adapter and a bottom surface of the lower portion of the shield.

2. The process kit of claim 1, wherein the heater includes at least one of a lamp, radiative heating, or embedded resistive heaters.

3. The process kit of claim 1, further comprising a sealing surface on which a process chamber lid rests to seal off an inner volume of the process chamber when the process kit is placed in the process chamber, and a resting surface disposed opposite the sealing surface to be supported by a chamber wall of the process chamber when the process kit is placed in the process chamber.

4. The process kit of claim 1, further comprising a path disposed between the shield and the adapter section sufficient to allow a cleaning gas to be introduced into the process chamber.

5. The process kit of claim 1, wherein the adapter section includes a port configured to be coupled to a remote plasma source to provide an activated cleaning gas into an inner volume of the process chamber during use.

6. A process chamber configured for processing a substrate, comprising:
 a chamber wall at least partially defining an inner volume within the process chamber;
 a sputtering target disposed in an upper section of the inner volume;
 a substrate support having a support surface to support a substrate below the sputtering target; and
 a process kit surrounding the sputtering target and the substrate support, the process kit comprising:
  a shield having a cylindrical body having an upper portion and a lower portion, wherein the upper portion includes an outwardly extending ledge;
  an adapter section having a resting surface that is supported by the chamber wall, a sealing surface opposite the resting surface on which a process chamber lid rests to seal off the inner volume of the process chamber, and an inwardly extending ledge that contacts the outwardly extending ledge of the shield at a position above the lower portion of the shield; and
  a heater supported in an annular cavity of the adapter section and configured to be electrically coupled to at least one power source of the processes chamber to heat the shield, wherein the annular cavity is disposed beneath a cavity defined by a top surface of a lower portion of the adapter and a bottom surface of the lower portion of the shield.

7. The process chamber of claim 6, wherein the heater includes at least one of a lamp, radiative heating, or embedded resistive heaters.

8. The process chamber of claim 6, further comprising a path disposed between the shield and the adapter section to allow a cleaning gas to be introduced into the process chamber.

9. The process chamber of claim 6, wherein the adapter section includes a port configured to be coupled to a remote plasma source configured to provide an activated cleaning gas into the inner volume of the process chamber during use.

10. The process chamber of claim 6, further comprising at least one of:
 a gas supply configured to provide a cleaning gas into the inner volume of the process chamber and either an RF power source, a DC power source, or a microwave power source coupled to the process chamber; or
 a remote plasma source coupled to the process chamber and configured to provide an activated cleaning gas into the inner volume of the process chamber.

11. The process chamber of claim 10, wherein at least one of:
 the RF power source is coupled to at least one of a biasable pedestal of the substrate support or a cover ring of the shield,
 the DC power source is coupled to the cover ring of the shield, or
 the microwave power source further comprises a plurality of dielectric resonators arranged in a circular configuration around a periphery of the sputtering target.

12. The process chamber of claim 6, wherein a bottom surface of the upper portion is disposed above the heater.

13. The process chamber of claim 6, wherein the sputtering target is made from at least one of carbon, silicon, silicon nitride, aluminum, tungsten, tungsten carbide, copper, titanium, titanium nitride, titanium carbide, carbon nitride.

14. The process kit of claim 1, wherein a bottom surface of the upper portion is disposed above the heater.

15. The process kit of claim 4, wherein the path is a gap disposed between an annular leg that extends into an annular trench formed in a deposition ring disposed below the shield.

16. The process chamber of claim 8, wherein the path is a gap disposed between an annular leg that extends into an annular trench formed in a deposition ring disposed below the shield.

17. A process kit configured for use in a process chamber for processing a substrate, comprising:
 a shield having a cylindrical body having an upper portion and a lower portion;
 an adapter section configured to be supported on walls of the process chamber and having an inwardly extending ledge that contacts a bottom surface of the upper portion of the shield; and
 a heater supported in an annular cavity of the adapter section at a position below the bottom surface of the upper portion of the shield and configured to be electrically coupled to at least one power source of the processes chamber to heat the shield, wherein the annular cavity is disposed beneath a cavity defined by a too surface of a lower portion of the adapter and a bottom surface of the lower portion of the shield.

18. The process kit of claim 17, wherein the inwardly extending ledge contacts an outwardly extending ledge of the shield at a position above the lower portion of the shield.

* * * * *